(12) United States Patent
Davison (10) Patent No.: US 10,510,919 B2
(45) Date of Patent: Dec. 17, 2019

(54) METHOD FOR ENHANCING THE EFFICIENCY OF A SOLAR MODULE BY SUBJECTING IT TO EXTREMELY-LOW-FREQENCY EMR

(71) Applicant: Ronald Clark Davison, Mapleton, UT (US)

(72) Inventor: Ronald Clark Davison, Mapleton, UT (US)

( * ) Notice: Subject to any disclaimer, the term of this patent is extended or adjusted under 35 U.S.C. 154(b) by 0 days.

(21) Appl. No.: 15/913,899

(22) Filed: Mar. 6, 2018

(65) Prior Publication Data

US 2018/0254372 A1 Sep. 6, 2018

Related U.S. Application Data

(60) Provisional application No. 62/467,395, filed on Mar. 6, 2017.

(51) Int. Cl.
*H01L 31/18* (2006.01)
*H01L 31/06* (2012.01)
*H01L 31/02* (2006.01)

(52) U.S. Cl.
CPC ...... *H01L 31/186* (2013.01); *H01L 31/02021* (2013.01); *H01L 31/06* (2013.01)

(58) Field of Classification Search
None
See application file for complete search history.

(56) References Cited

U.S. PATENT DOCUMENTS

| | | | |
|---|---|---|---|
| 4,661,370 A * | 4/1987 | Tarrant | H01L 21/326 136/249 |
| 7,999,173 B1 * | 8/2011 | Ashpis | H01L 31/042 136/251 |
| 2017/0288085 A1 * | 10/2017 | Rey-Garcia | H01L 21/67173 |

* cited by examiner

*Primary Examiner* — Andres Munoz
(74) *Attorney, Agent, or Firm* — Angus C. Fox, III (57) ABSTRACT

The present invention provides a method for enhancing the efficiency of a photovoltaic module by subjecting it to extremely-low-frequency (ELF) electromagnetic radiation (EMR). The ELF EMR can be provided by a plurality of identical Jacob's ladders and the traveling arcs generated thereby. Alternatively, the ELF EMR can be provided by passing the photovoltaic module over an array of quartz discharge tubes in which arcs are generated between pairs of tungsten electrodes. The photovoltaic module is subjected to multiple passes in order to provide an optimum level of enhancement to the module.

17 Claims, 8 Drawing Sheets

METHOD FOR ENHANCING THE EFFICIENCY OF A SOLAR MODULE BY SUBJECTING IT TO EXTREMELY-LOW-FREQENCY EMR

BACKGROUND OF THE INVENTION

1. Field of the Invention

This invention relates, generally, to photovoltaic modules and, more particularly, to a method for enhancing the efficiency of such modules.

2. History of the Prior Art

A solar module refers to a photovoltaic (PV) module that is designed to convert electromagnetic energy in the ultraviolet, visible and infrared spectrum to electricity.

Although length and width varies slightly, most companies manufacture solar panels in standard sizes. The most common size PV module used for residential installations, which is typically packaged as a 6×10 array of photovoltaic cells, is 1650 mm (~65 inches) by 990 mm (~39 inches). Likewise, the most common size for commercial applications, which is typically packaged as a 6×12 array of photovoltaic cells, is 1955 mm (~77 inches) by 990 mm (~39 inches). PV modules are used to generate and supply electricity for commercial and residential applications. Each module is rated by its DC power output under standard test conditions (STC). Power output ratings generally range from 100 to 365 watts. The efficiency of a module determines the area of the module for a given rated output. Thus, a 230-watt module having 8 percent efficiency will have twice the area of a 230-watt module that is 16 percent efficient.

Solar cell efficiency refers to the portion of energy in the form of sunlight that can be converted via photovoltaics into electricity. The efficiency of the solar cells used in a photovoltaic system, in combination with latitude and climate, determines the annual energy output of the system. For example, a solar module with 20% efficiency and an area of 1 square meter will produce 200 watts at Standard Test Conditions, but it can produce more when the sun is high in the sky and will produce less in cloudy conditions and when the sun is low in the sky. In central Colorado, which receives annual insolation (the power, over all wavelenghts, received on Earth per unit area on a horizontal surface) of 5.5 kilowatt hours per square meter per day, such a module can be expected to produce 440 kilowatt hours of energy per year. However, in Michigan, which receives only 3.5 kWh/m$^2$/day, because it is farther from the equator, annual energy yield will drop to 280 kilowatt hours for the same module. At more northerly European latitudes, yields from the same module are significantly lower: only 175 kilowatt hours per year in southern England.

Several factors affect a cell's conversion efficiency value, including its reflectance efficiency, thermodynamic efficiency, charge carrier separation efficiency, and conduction efficiency values.

As of December 2014, the world record for solar cell efficiency at 46% was achieved by using multi-junction concentrator solar cells developed from collaboration efforts of Soitec, CEA-Leti, France together with Fraunhofer ISE, Germany. Solar cells with multiple band gap absorber materials improve efficiency by dividing the solar spectrum into smaller bins where the thermodynamic efficiency limit is higher for each bin.

Conventional photovoltaic systems however have only one p-n junction and are therefore subject to a lower efficiency limit, called the "ultimate efficiency" by Shockley and Queisser. Photons with an energy below the band gap of the absorber material cannot generate an electron-hole pair, so their energy is not converted to useful output, and only generates heat if absorbed. For photons with an energy above the band gap energy, only a fraction of the energy above the band gap can be converted to useful output. When a photon of greater energy is absorbed, the excess energy above the band gap is converted to kinetic energy of the carrier combination. The excess kinetic energy is converted to heat through phonon interactions as the kinetic energy of the carriers slows to equilibrium velocity. Traditional single-junction cells have a maximum theoretical efficiency of 33.16 percent. There are a few commercially available solar modules that exceed 22 percent efficiency, and efficiencies in the 24 percent range have been reported. Given that a single solar module can produce only a limited amount of power, most installations contain multiple modules. A photovoltaic system typically includes an array of photovoltaic modules, an inverter, a battery pack for storage, interconnection wiring, and, optionally, a solar tracking mechanism.

SUMMARY OF THE INVENTION

The present invention provides a method for enhancing the efficiency of a photovoltaic module by subjecting it to extremely-low-frequency electromagnetic radiation (EMR). The active surface of most standard photovoltaic modules are arranged in an array of six columns, with each column having ten or twelve cells in a linear arrangement. The active surface is the major surface of the module that is positioned facing the sun. A silicon photovoltaic module may be treated in a number of ways.

A first embodiment method of treatment involves orienting the columns of the photovoltaic module vertically against an insulated, parallel array of six identical Jacob's ladders—one ladder aligned with each column of the module. After subjecting the module to at least one run of the traveling arc up each ladder at an inter-electrode potential of about 15,000 volts (preferably simultaneously to reduce processing time), the array is rotated 180 degrees, aligned in the same manner, and the process is repeated. There is an optimum number of passes of the arcs over the array that will result in a maximum efficiency enhancement. Passes of the arcs beyond the optimum number will result in degradation of module performance. Each of the Jacob's ladders is insulated from adjacent ladders to prevent arcing between electrodes of adjacent ladders, and a transparent polymeric plastic sheet is placed between the Jacob's ladder array and the photovoltaic module. A presently preferred transparent polymeric plastic sheet is about 6.35 mm thick and is made of polycarbonate thermoplastic. Efficiency enhancements to the treated photovoltaic modules of up to 35 percent have been infrequently observed. Though a 25 percent improvement is not uncommon, the average increase is about 12 percent. In other words, a module originally having an efficiency rating of 16 percent would have an efficiency rating of about 20 percent following a 25 percent efficiency enhancement, and a bit more than 18 percent efficiency with a 12 percent enhancement. The high-voltage traveling arc generates a wide spectrum of electromagnetic energy, as well as magnetic fields that repeatedly form, collapse and reform, following the right-hand rule, as the transformer voltage alternates at 60 hertz.

A second embodiment method of treatment involves moving the photovoltaic module at a constant speed multiple times over an array of arc discharge tubes, open to the atmosphere, positioned in close proximity to the module. Cylindrical fused quartz discharge tubes having a diameter of about 25.4 mm and a thickness of about 3 mm are deemed a preferred size. An arc is produced in the discharge tube when high voltage is applied to a pair of tungsten electrodes, installed at opposite ends of the discharge tube. The length of the discharge tube is dependent on the high voltage output available from the transformers and the width of the photovoltaic cells. If transformer output is around 15 KV, two discharge tubes, in staggered arrangement, are used, with each discharge tube being about 100 mm in length. The electrodes are set so that spacing between them is about 76 mm. Each discharge tube covers half of a column of the PV module. Thus, 12 discharge tubes are required to cover all six columns of a standard size module. If transformer output is around 30 KV, a single discharge tube having a length of about 178 mm is used for each column of the module. Electrode spacing is set at about 152 mm.

It is believed that other forms of arc-generated electromagnetic radiation, other than that generated by arcing between electrodes in an atmospheric environment may accomplish the same result.

At this point, the quantum mechanical changes that are taking place at the atomic level in the silicon substrate are still unknown. It is possible that physical changes in the silicon substrate facilitate the forming of electron-hole pairs, which are responsible for the photovoltaic current that is produced when light impinges on the module. Alternatively, the physical changes may hamper the recombination of electron-hole pairs that are formed, thereby boosting output current.

DETAILED DISCLOSURE OF THE INVENTION

The invention will now be described in detail with reference to the attached drawing figures. It should be understood that the drawings are intended to be merely illustrative of the invention, and may not be drawn accurately to scale.

The present invention provides a method for enhancing the efficiency of a photovoltaic module by subjecting it to a high-voltage traveling arc. A photovoltaic module is treated by orienting it vertically against a columnated, insulated array of identical arc traveling apparatuses (Jacob's ladders). When using V-shaped Jacob's ladders, after subjecting the module to at least one run of the arc up each ladder at an inter-electrode potential within a range of about 13,000 to 15,000 volts (preferably simultaneously to reduce processing time), the module is rotated 180 degrees and the process is repeated. If the Jacob's ladders have electrodes that are generally parallel over the entire column being treated, then a 180-degree rotations of the module is deemed to be unnecessary. There is an optimum finite number of passes of the arcs over the array that will result in a maximum efficiency enhancement. Passes of the arcs beyond the optimum number will result in degradation of module performance. Using the equipment herein disclosed, the optimum number of runs of the arc up the ladder (known as zaps, because each run of the arc up the ladder begins with an initial loud zap) over a twelve-cell column averages about 25. In order to determine the optimum number of zaps for maximum efficiency enhancement for a particular type of panel, at least one such panel must be subjected to the arc treatment and measured either after each zap, or after each set of a fixed number of zaps. When measured efficiency of the panel begins to decrease, the optimum number of zaps for that panel is known to be slightly less than the total number of zaps to which the module has been subjected prior to the final measurement. For treatment of a module, the number of zaps per minute is determined for a particular Jacob's ladder configuration given the prevailing temperature and humidity data. Once the optimum number of zaps is known for a particular module and the number of zaps per minute is known for a particular ladder or group of ladders, the number of total zaps can be set simply by setting a timer. Each of the Jacob's ladders is insulated from adjacent ladders, and an insulative polymeric plastic sheet is placed between the Jacob's ladder array and the photovoltaic module. A presently preferred transparent polymeric plastic sheet is made of polycarbonate having a thickness within a range of about 3.175-6.35 mm (0.125-0.25 inch) in thickness. Efficiency enhancements to the treated photovoltaic module of up to eight percent have been observed, with the average falling within a range of about four to six percent.

A Jacob's ladder (more formally, a high voltage traveling arc) is a device for producing a continuous train of large arcs that rise upward because of rising convection currents. The spark gap is formed by two electrodes, approximately vertical but gradually diverging from each other towards the top in a narrow V shape. It was named for the "Jacob's ladder to heaven" described in the book of Genesis in the Bible.

When high voltage is applied to the gap, a spark forms across the bottom of the wires where they are nearest each other, rapidly changing to an electric arc. Air breaks down at about 30 kV/cm, depending on humidity, temperature, etc. Apart from the anode and cathode voltage drops, the arc behaves almost as a short circuit, drawing as much current as the electrical power supply can deliver, and the heavy load dramatically reduces the voltage across the gap. The heated ionized air rises, carrying the current path with it. As the trail of ionization gets longer, it becomes more and more unstable, finally breaking. The voltage across the electrodes then rises and the spark re-forms at the bottom of the device. This cycle leads to an exotic-looking display of electric white, yellow, blue or purple arcs, which is often seen in films about mad scientists. The device was a staple in schools and science fairs of the 1950s and 1960s, typically constructed out of a Model T spark coil or any other source of high voltage in the 10,000-30,000-volt range, such as a neon sign transformer (5-15 kV) or a television picture tube circuit (flyback transformer) (10-28 kV), and two coat hangers or rods assembled in a V shape. For larger ladders, microwave oven transformers connected in series, voltage multipliers and utility pole transformers (pole pigs) run in reverse (step-up) are commonly used.

Figure 1:
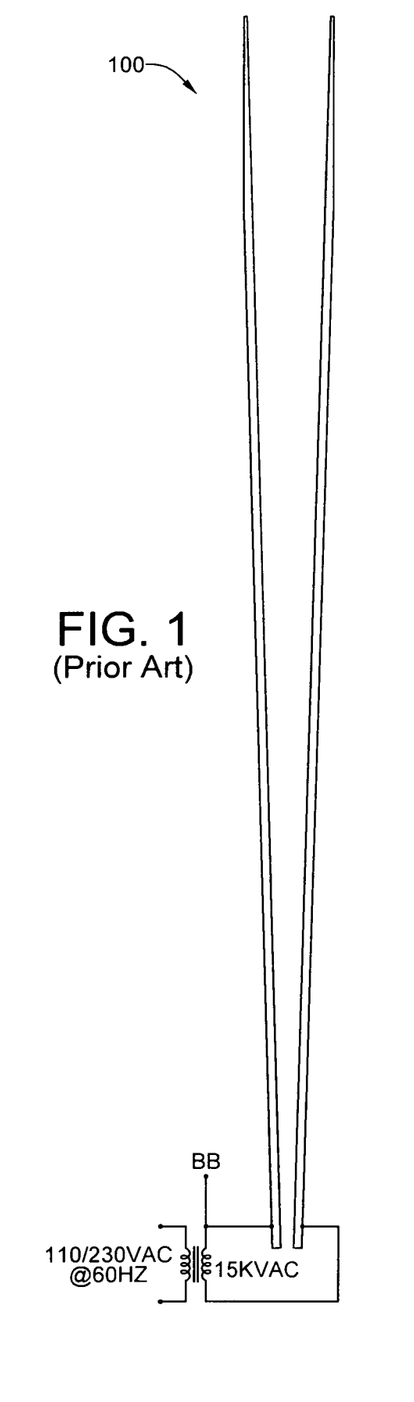
FIG. 1 is a front elevational view of a V-shaped traveling arc apparatus known as a Jacob's ladder, shown with its high-voltage driver circuit.

Referring now to FIG. 1, a first embodiment high-voltage traveling arc apparatus (Jacob's ladder), having a V-shaped configuration, is shown in combination with its high-voltage driver circuit that applies an alternating voltage of about 15,000 volts to the electrodes. An input of either 110 VAC or 230 VAC may be used, as long as the output to the electrodes is about 14,000 VAC. The frequency of the alternating current can be either 50 or 60 Hz, both of which are in common use throughout the world.

Figure 2:
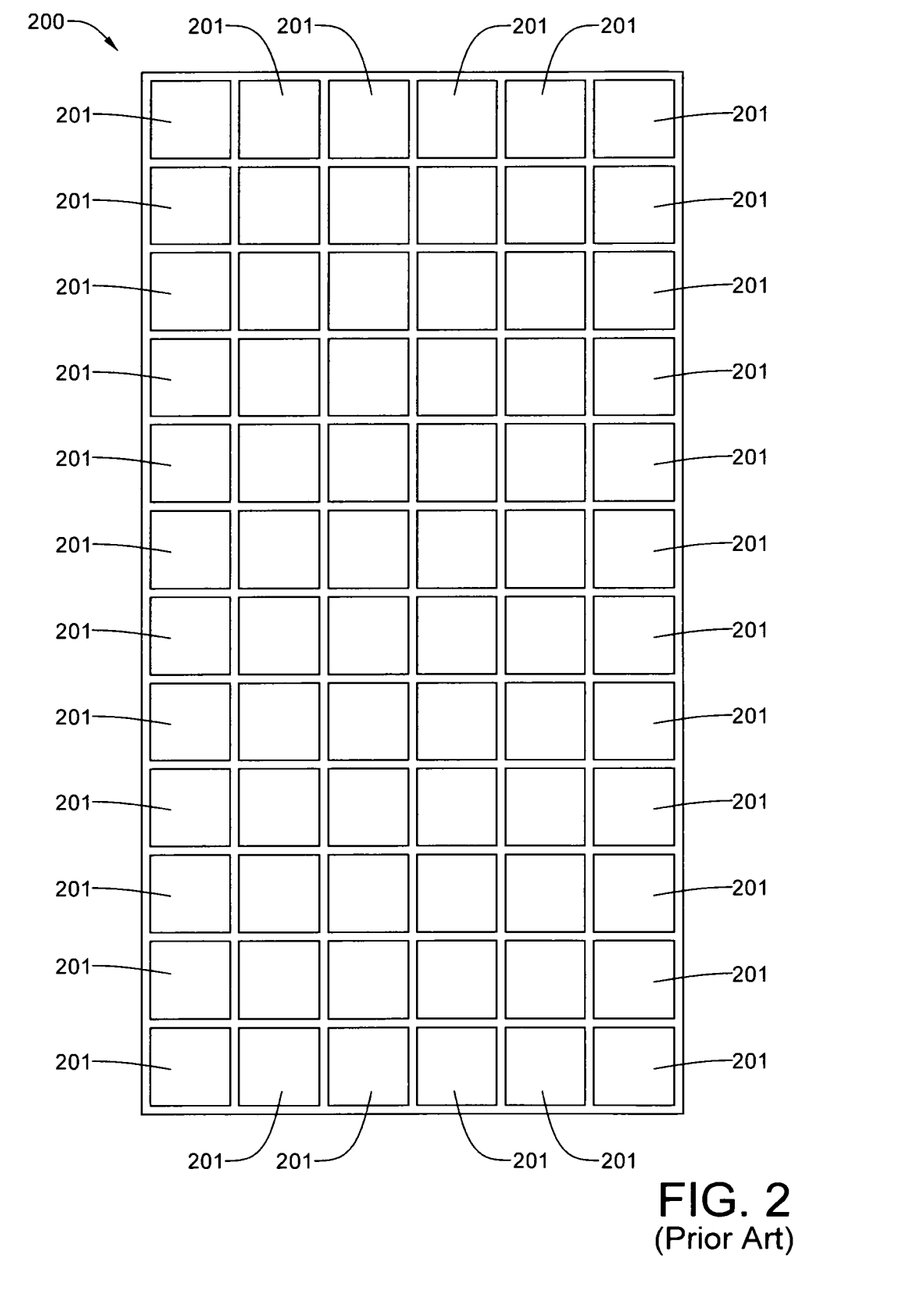
FIG. 2 is a top plan view of a conventional photovoltaic module having an array of 6×12 photovoltaic cells.

Referring now to FIG. 2, a conventional 1955 mm (~77 inches) by 990 mm (~39 inches) photovoltaic module 200 for commercial applications, having a 6×12 array of photovoltaic cells 201, is shown. As will be seen in FIGS. 4 and 5, each of the six columns containing twelve cells each will be treated by a single traveling arc apparatuses (Jacob's ladder) 100.

Figure 3:
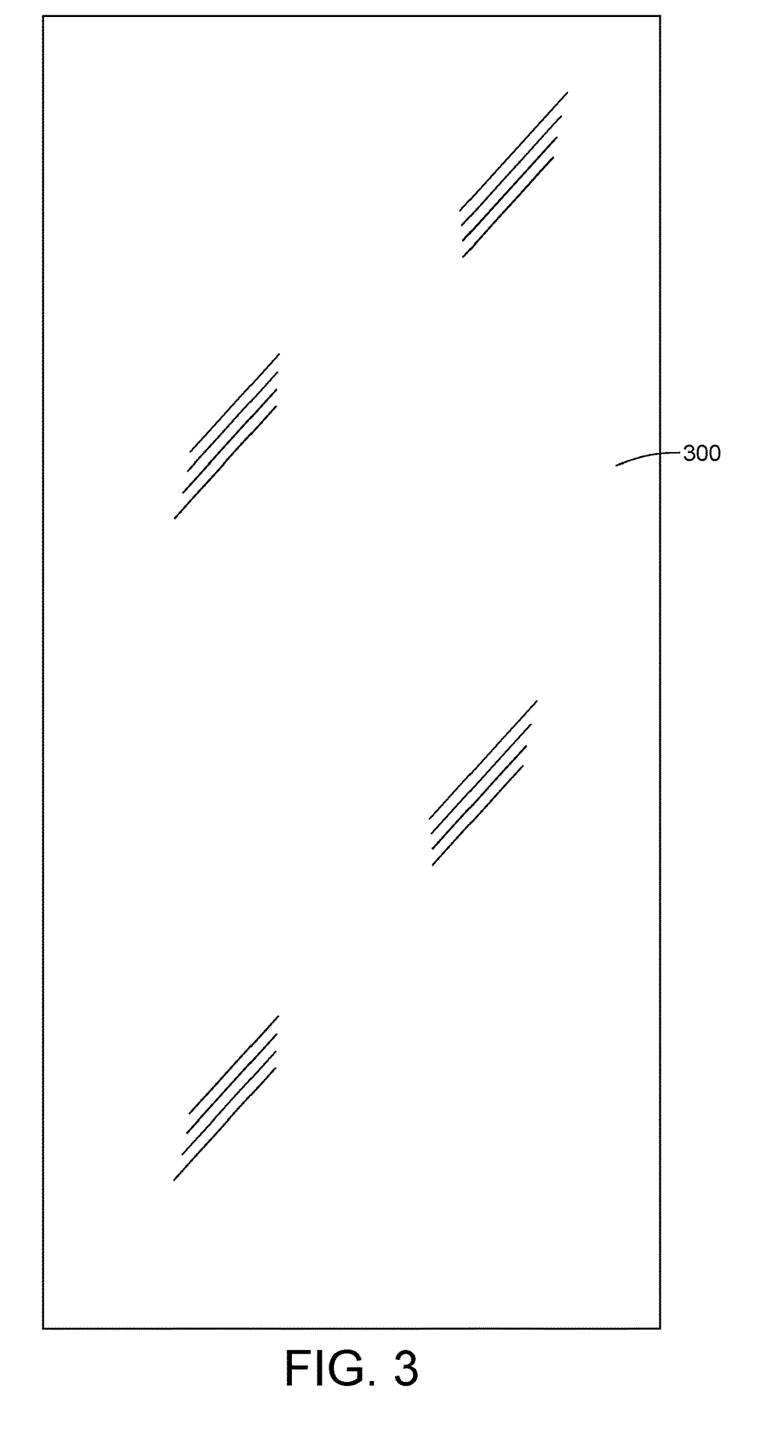
FIG. 3 is a front elevational view of a sheet of polycarbonate thermoplastic that is used to shield the solar module from arcs from the Jacob's ladders.
Figure 4:
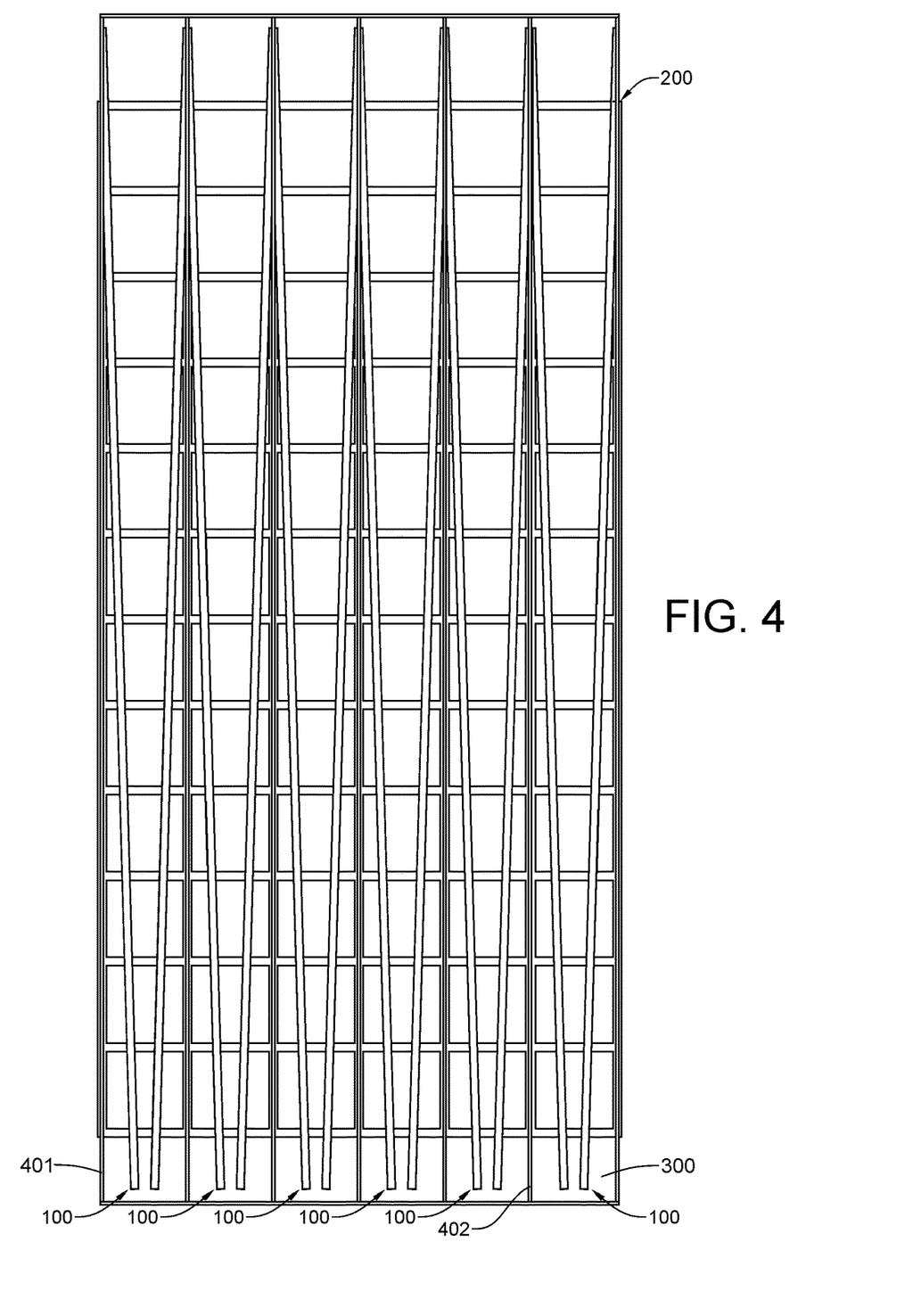
FIG. 4 is a front elevational view of six traveling arc apparatuses of the type shown in FIG. 1, each of which is centered on a twelve-cell column of the photovoltaic module, insulated from one another, and insulated from the photovoltaic module.

Referring now to FIG. 3, a single polycarbonate thermoplastic insulator sheet 300 having a uniform thickness within a range of about 3.175-6.35 mm (0.125-0.25 inch) in thickness is slightly wider and longer than the photovoltaic module of FIG. 2. Referring now to FIG. 4, six high-voltage traveling arc apparatuses 100, are mounted within an insulated open box. Each of the apparatuses 100 is centered on a twelve-cell column of the photovoltaic module 200. The polycarbonate sheet 300 functions as the bottom of the box. There is an outer frame 401 and insulative strips 402, which separate and insulate each of the high-voltage traveling arc apparatuses 100 from one another.

Figure 5:
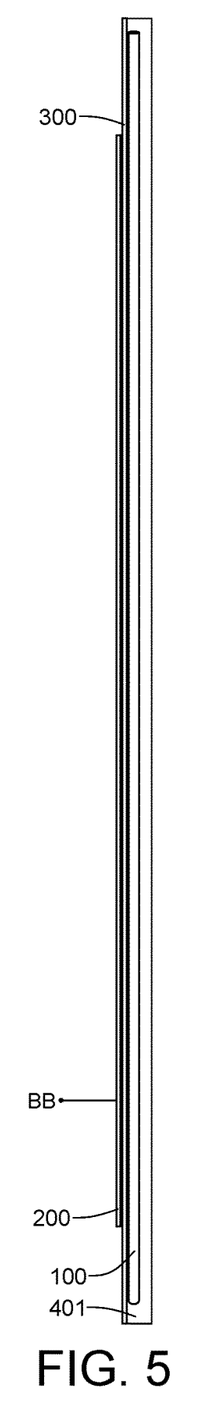
FIG. 5 is a side elevational view of the assembly of either FIG. 4.

Referring now to FIG. 5, the assembly of FIG. 4 is shown in a side view. The photovoltaic module 200, the polycarbonate thermoplastic sheet 300, a high-voltage traveling arc apparatus 100, and the insulated frame 401 are visible in this view. It will be noted that the rear of the photovoltaic module 200 has a back-bias connection BB. This back-bias connection corresponds to the negative output terminal of the module 200. It will be further noted that in FIG. 4, the photovoltaic module 200 is placed directly against the thermoplastic sheet 300, and the traveling arc apparatus is also placed directly against the thermoplastic sheet 300. Thus, the traveling arc will be about 3.175 to 6.35 mm away from the active surface of the photovoltaic module 200, depending on the thickness of the thermoplastic sheet 300.

Figure 6:
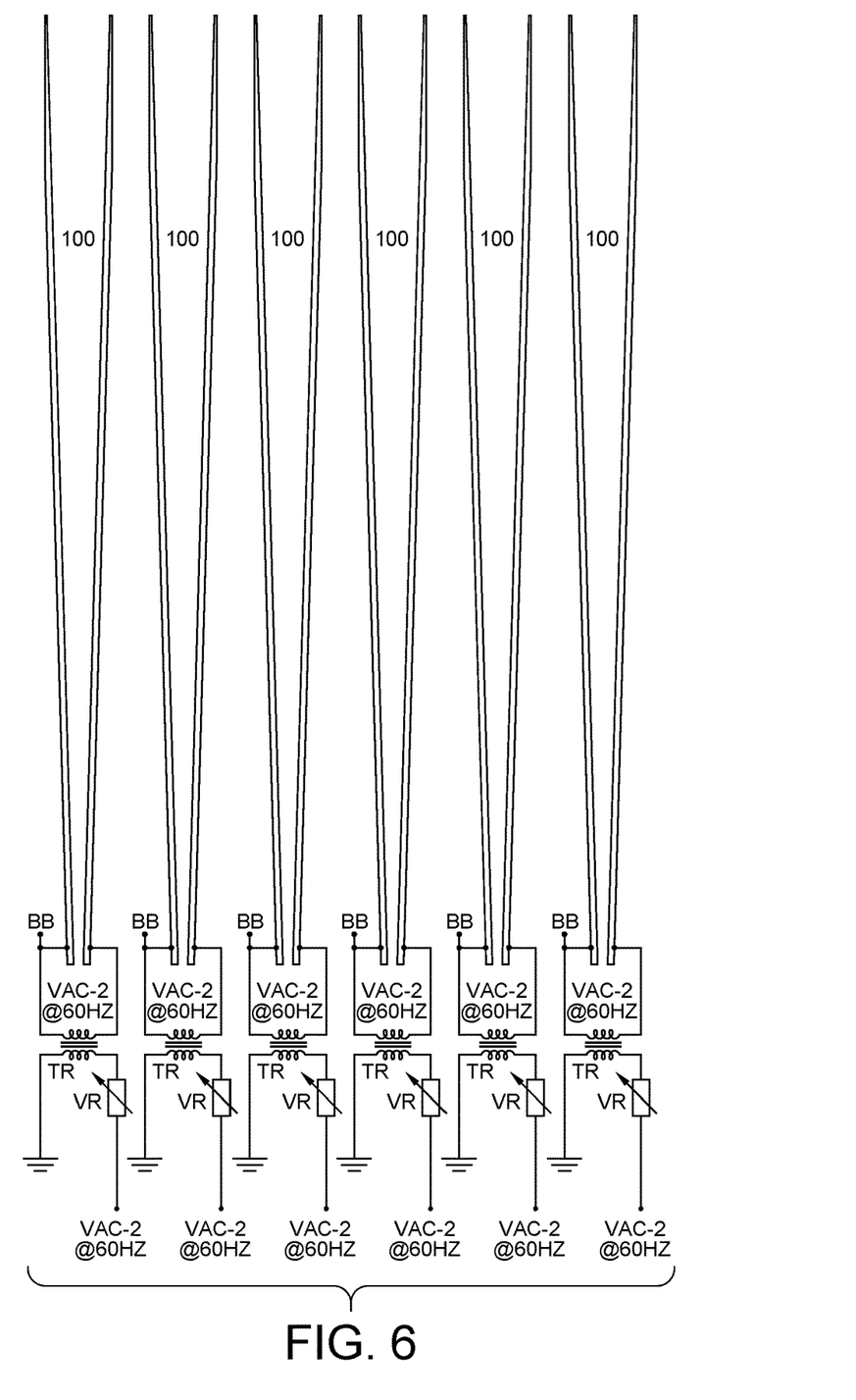
FIG. 6 is a circuit diagram, which includes six Jacob's ladders, each with its own driver circuitry which includes a step-up transformer and a rheostat to fine tune the arc voltage.

Referring now to FIG. 6, a circuit, which includes six Jacob's ladders 100, each with its own driver circuitry which comprises a step-up transformer TR and a rheostat VR for fine tuning the arc voltage. Although this particular embodiment shows the voltage source being 110 VAC line current, 230 VAC can also be employed, which would require step-up transformers having fewer turns on the secondary windings. Variable resistors VR (rheostats) are used to adjust the arc voltage to about 14-15 KVAC, as too low secondary voltage results in unstable arcs across the Jacob's ladders, and too high secondary voltage results in the formation of traces in and other damage to the insulator sheet 300. It will be noted that one side of the high-voltage output of one of the step-up transformers TR has a back-bias output BB. For improved module enhancement results, this output BB is connected directly to the back-bias connection BB on the rear of the photovoltaic module 200. It should be emphasized that this connection provides only a voltage bias to the rear of the photovoltaic module. Thus, there is no current flow and no power is used by this connection. It should also be pointed out that the back-bias output BB can be provided by any one of the six step-up transformers TR. It takes about 29 seconds for an arc to climb each Jacob's ladder 100. About twenty-five such climbs are made and the panel is reversed in direction and the process is repeated in order to provide more even treatment of each column of photovoltaic cells in a module 200.

A second embodiment method of treating PV modules will now be described using arcs generated within fused quartz discharge tubes. The second embodiment method of treatment involves moving the photovoltaic module at a constant speed multiple times over an array of arc discharge tubes, open to the atmosphere, positioned in close proximity to the module. Cylindrical fused quartz discharge tubes having a diameter of about 25.4 mm and a thickness of about 3 mm are deemed a preferred size. An arc is produced in the discharge tube when high voltage is applied to a pair of tungsten electrodes, installed at opposite ends of the discharge tube. The arc should be no more than about 13 mm from the active surface of the solar module 200.

Figure 7:
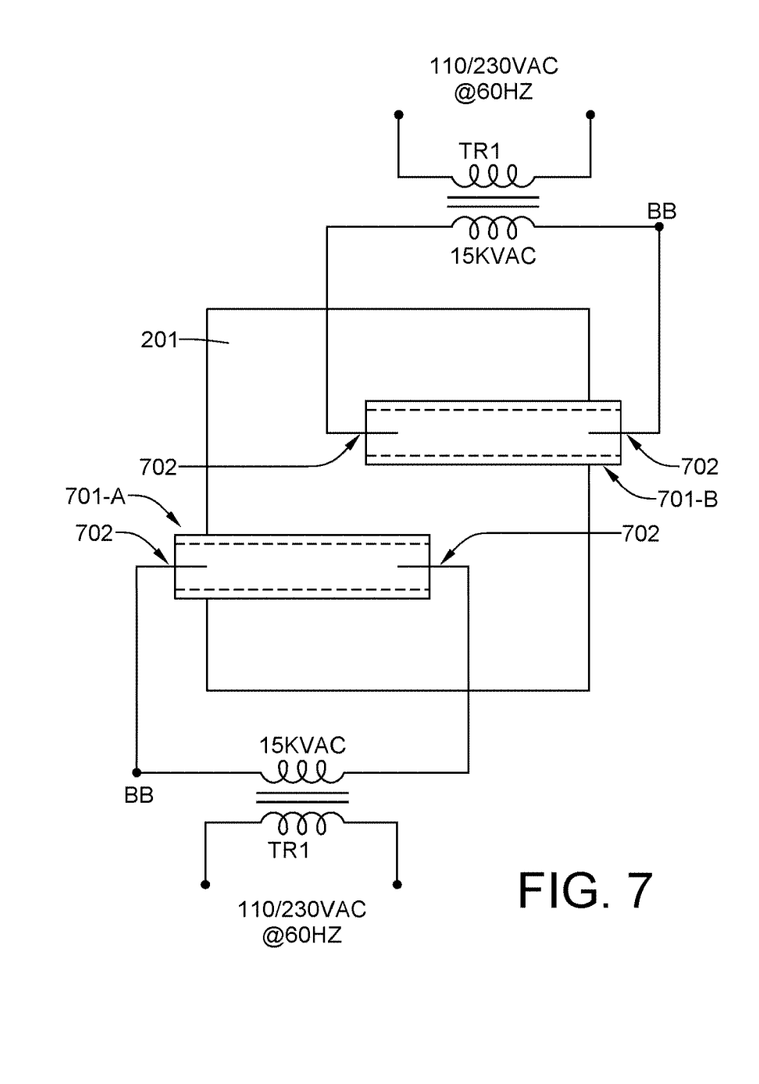
FIG. 7 is a staggered arrangement of a pair of discharge tubes overlaid on a single photovoltaic cell.
Figure 11:
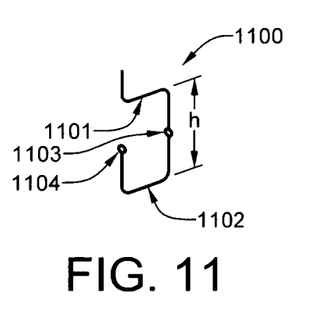
FIG. 11 is a clip that can be used to maintain a tungsten electrode in each end of a discharge tube.

Referring now to FIG. 7, a staggered arrangement of a pair of discharge tubes 701-A and 701-B is overlaid on a single photovoltaic cell 201. Each discharge tube is equipped with a tungsten electrode 702 at each end thereof. Each electrode 702 is held in place with a clip 1101, which is shown in FIG. 11. When the transformers TR1 are powered up, an arc is generated within each discharge tube 701-A and 701-B by ionization of the air molecules between the tips of the electrodes 702. As each cell 201 in a column of the PV module 200 moves over the pair of discharge tubes 701-A and 701-B, half of each cell 201 receives electromagnetic treatment from the arc generated in one of the discharge tubes 701-A or 701-B. Thus, discharge tube pair provides treatment for an entire cell 201. The length of the discharge tube is dependent on the high voltage output available from the transformers and the width of the photovoltaic cells. If transformer output is around 15 KV, two discharge tubes, in staggered arrangement, are used, as shown in FIG. 7, with each discharge tube being about 100 mm in length. The electrodes are set so that spacing between them is about 76 mm. Each discharge tube covers half of a column of the PV module. Thus, 12 discharge tubes are required to cover all six columns of a standard size module.

Figure 8:
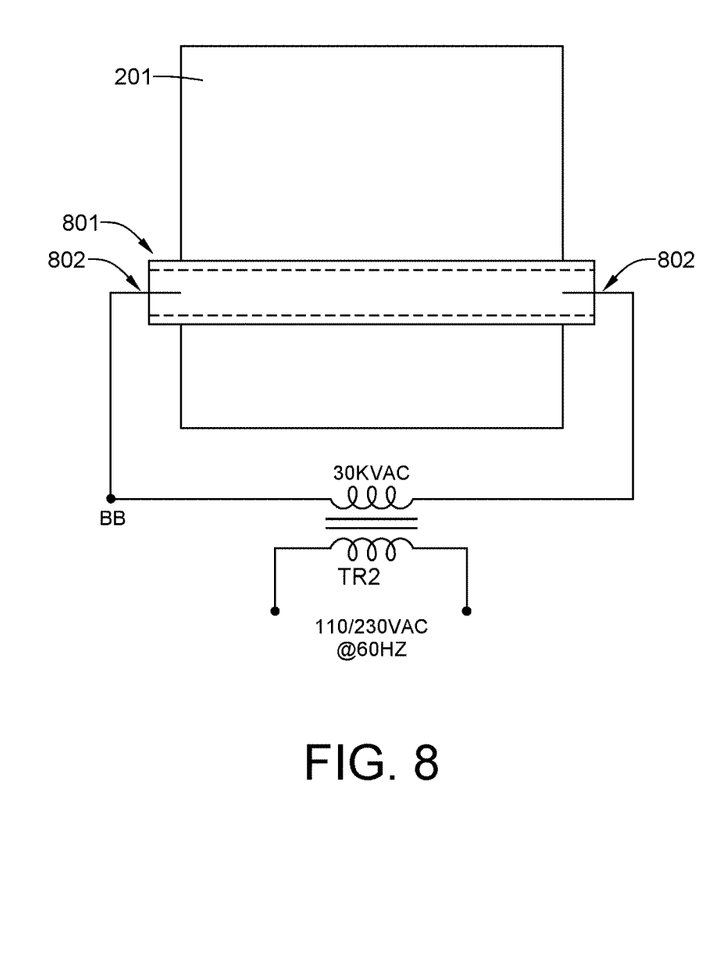
FIG. 8 is a single discharge tube overlaid on a single photovoltaic cell.

Referring now to FIG. 8, a single discharge tube 801 is overlaid on a single photovoltaic cell 201. The discharge tube 801 is equipped with a tungsten electrode 802 at each end thereof. Each electrode 802 is held in place with a clip 1101, which is shown in FIG. 11. When the transformer TR2 is powered up, an arc is generated within discharge tube 801 by ionization of the air molecules between the tips of the electrodes 802. Although such a discharge tube 801 requires greater voltage to generate an arc that is about twice as long as those generated in discharge tubes 701-A and 701-B, only a single discharge is required for each cell 201 in each column of a PV module 200. As each cell 201 in a column of the PV module 200 moves over the a discharge tubes 801, each cell 201 receives electromagnetic treatment from the arc generated in the discharge tubes 801. Thus, discharge tube 801 provides treatment for an entire cell 201. If transformer output is around 30 KV, such as is the case for the apparatus of FIG. 8, a single discharge tube having a length of about 178 mm is used for each column of the module. Electrode spacing is set at about 152 mm.

It should be evident that the polycarbonate sheet 300 and the fused quartz discharge tubes 701-A, 701-B and 801 act as insulative barriers which protect the active surface of the photovoltaic module 200 from contact with the arc.

Figure 9:
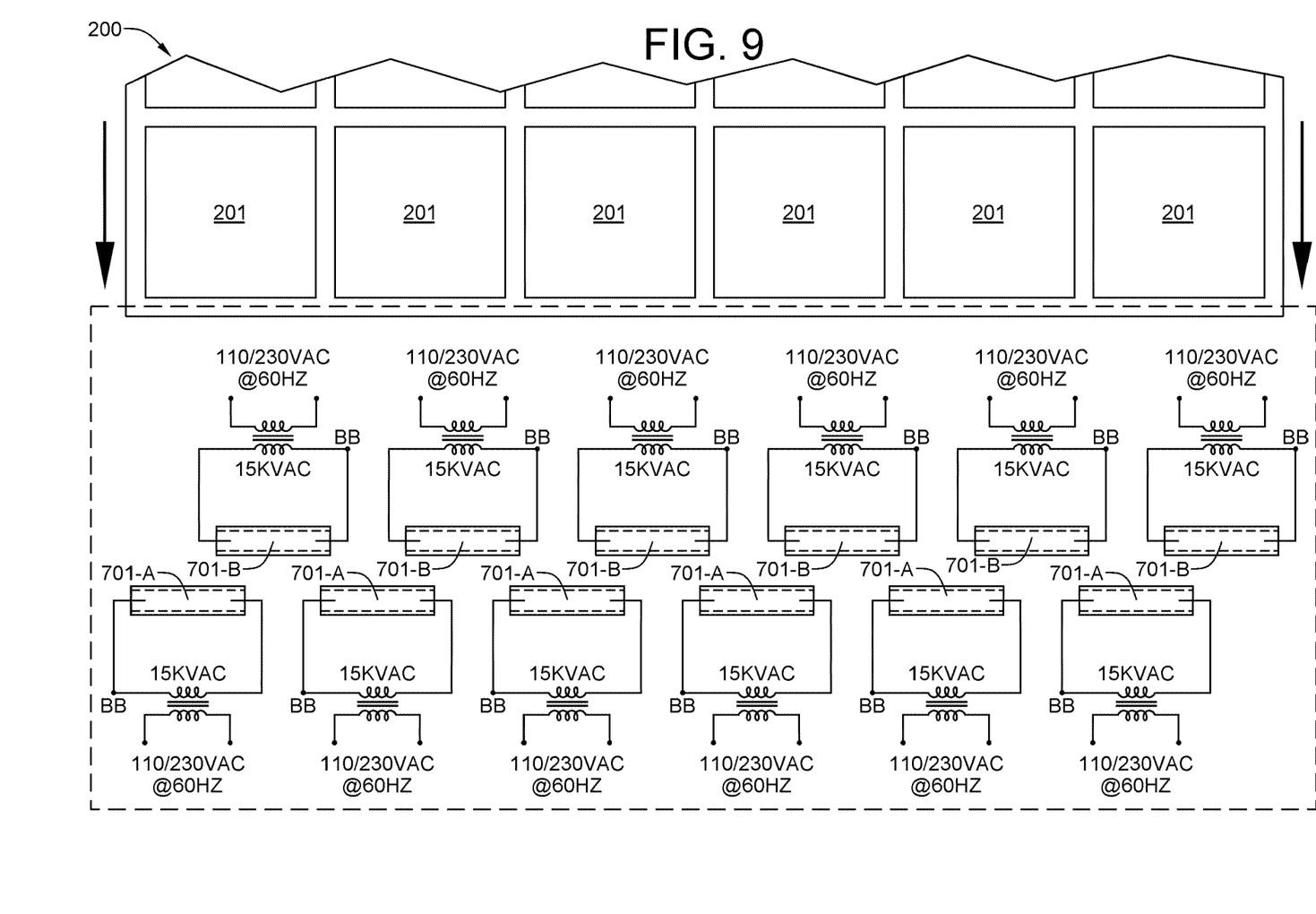
FIG. 9 is an array of six staggered pairs of discharge tubes spaced to treat a PV module, which will be downwardly moved over the discharge tube array.

Referring now to FIG. 9, an array of six staggered pairs of discharge tubes, as shown in FIG. 7, are spaced to treat a PV module 200, which will be downwardly moved over the discharge tube array. Each discharge tube pair is aligned with a single column of photovoltaic cells 201. For a conventional photovoltaic module 200 having dimensions of about 1955 mm (~77 inches) by 990 mm (~39 inches) photovoltaic module 200 for commercial applications, the module is moved at a constant rate over the discharge tubes so that all portions of the array are treated equally for about 30 seconds. Such treatment can be repeated some 25 times for maximum enhancement of panel efficiency.

Figure 10:
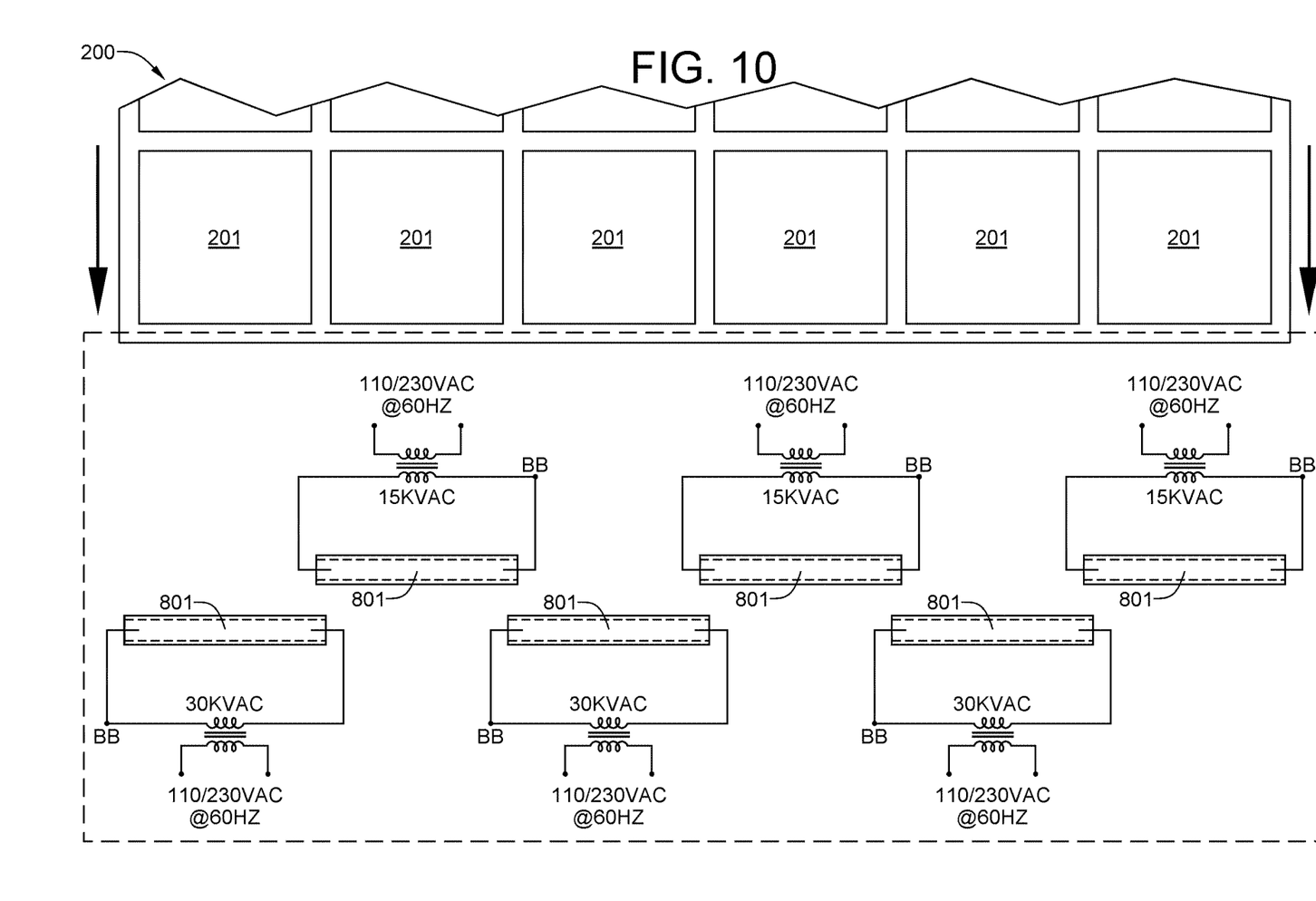
FIG. 10 is an array of six staggered discharge tubes arranged to treat a PV module, which will be downwardly moved over the discharge tube array.

Referring now to FIG. 10, an array of six staggered discharge tubes arranged to treat a PV module, which will be downwardly moved over the discharge tube array. Each discharge tube is aligned with a single column of photovoltaic cells 201. For a conventional photovoltaic module 200 having dimensions of about 1955 mm (~77 inches) by 990 mm (~39 inches) photovoltaic module 200 for commercial applications, the module is moved at a constant rate over the discharge tubes so that all portions of the array are treated equally for about 30 seconds. Such treatment can be repeated some 25 times for maximum enhancement of panel efficiency.

Referring now to FIG. 11, a clip 1100 can be used to axially position a tungsten electrode in each end of a discharge tube. The clip, which is preferably made of tungsten wire, has a height (h) that is equal to the inside diameter of the discharge tube. By slightly spreading the upper and lower horizontal members 1101 and 1102, respectively of the clip 1100 and sliding the clip into the end of discharge tube, the clip can be retained by spring force exerted against the tube walls. The tungsten electrode is inserted through apertures 1103 and 1104.

Although only a single embodiment of the method for enhancing the efficiency of a photovoltaic module by subjecting it to a high-voltage traveling arc has been shown and described, it will be obvious to those having ordinary skill in the art that changes and modifications may be made thereto without departing from the scope and spirit of the invention as may hereinafter be claimed.

What is claimed is:

1. A method for enhancing the efficiency of a photovoltaic module comprising the steps of:
subjecting an active surface of the photovoltaic module to electromagnetic radiation from at least one electric arc generated by ionizing atmospheric gases between a pair of spaced-apart electrodes, said at least one electric arc being insulated from the active surface of the photovoltaic module by a solid insulative material, and said at least one electric arc being maintained at a uniform distance from the active surface, said uniform distance having a range of about 3 mm to 13 mm.

2. The method for enhancing the efficiency of a photovoltaic module of claim 1, wherein said at least one electric arc is generated by a traveling arc apparatus that is spaced away from the active surface of the module by the solid insulative material.

3. The method for enhancing the efficiency of a photovoltaic module of claim 2, wherein said solid insulative material is polycarbonate.

4. The method for enhancing the efficiency of a photovoltaic module of claim 1, wherein each of said at least one electric arc is generated using frequencies within a range of 50-60 Hz.

5. The method for enhancing the efficiency of a photovoltaic module of claim 1, wherein said at least one electric arc is generated using a voltage of at least 14,000 VAC.

6. The method for enhancing the efficiency of a photovoltaic module of claim 1, wherein said at least one electric arc is generated within a cylindrical fused quartz discharge tube having an electrode positioned at each end of said cylindrical fused quartz discharge tube.

7. The method for enhancing the efficiency of a photovoltaic module of claim 6, wherein said electrodes are spaced about 76 mm apart for voltages of about 15 KVAC and 152 mm apart for voltages of about 30 KVAC.

8. The method for enhancing the efficiency of a photovoltaic module of claim 1, wherein the electromagnetic radiation is generated at a frequency of about 60 hertz.

9. The method for enhancing the efficiency of a photovoltaic module of claim 1, wherein the solid insulative material is selected from the group consisting of polycarbonate thermoplastic and fused quartz.

10. A method for enhancing the efficiency of a photovoltaic module comprising the steps of:
subjecting an active surface of the photovoltaic module to electromagnetic radiation (EMR) from at least one electric arc generated by ionizing atmospheric gases between a pair of spaced-apart electrodes that are insulated from the active surface by a solid insulative material.

11. The method for enhancing the efficiency of a photovoltaic module of claim 10, wherein said solid insulative material is selected from the group consisting of polycarbonate thermoplastic and fused quartz.

12. The method for enhancing the efficiency of a photovoltaic module of claim 10, wherein the active surface of the photovoltaic module is subjected to the ELF EMR by relative movement of the active surface at a constant rate with respect to a position of said at least one electric arc.

13. The method for enhancing the efficiency of a photovoltaic module of claim 10, wherein the at least one electric arc is maintained at a uniform distance from the active surface, said uniform distance having a range of about 3 mm to 13 mm.

14. The method for enhancing the efficiency of a photovoltaic module of claim 10, wherein each of said at least one electric arc is generated using frequencies within a range of 50-60 Hz.

15. The method for enhancing the efficiency of a photovoltaic module of claim 10, wherein said at least one electric arc is generated using a voltage of at least 14,000 VAC.

16. The method for enhancing the efficiency of a photovoltaic module of claim 10, wherein said at least one electric arc is generated within a cylindrical fused quartz discharge tube having an electrode positioned at each end of said cylindrical fused quartz discharge tube.

17. The method for enhancing the efficiency of a photovoltaic module of claim 16, wherein said electrodes are spaced about 76 mm apart for voltages of about 15 KVAC and 152 mm apart for voltages of about 30 KVAC.

\* \* \* \* \*